(12) United States Patent
Hallivuori et al.

(10) Patent No.: US 6,621,365 B1
(45) Date of Patent: Sep. 16, 2003

(54) METHOD AND APPARATUS PROVIDING A DUAL MODE VCO FOR AN ADAPTIVE RECEIVER

(75) Inventors: Juha Hallivuori, Tampere (FI); Pauli Seppinen, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/115,672

(22) Filed: Apr. 3, 2002

(51) Int. Cl.[7] .............................. H03B 5/08; H03B 5/12

(52) U.S. Cl. ............. 331/179; 331/117 R; 331/117 FE; 331/177 V; 331/181; 455/255

(58) Field of Search ................... 331/117 R, 117 FE, 331/117 D, 177 R, 177 V, 179, 181; 334/47, 52, 53, 61; 455/255, 266

(56) References Cited

U.S. PATENT DOCUMENTS 5,715,528 A * 2/1998 Kuo et al. ................. 455/142
6,144,299 A * 11/2000 Cole ........................ 340/572.1

OTHER PUBLICATIONS

Zanchi et al., "Automatic Amplitude Control Loop for a 2–V, 2.5–GHz LC–tank VCO", IEEE 2001, pp. 209–212.

* cited by examiner

Primary Examiner—David C. Mis
(74) Attorney, Agent, or Firm—Harrington & Smith LLP (57) ABSTRACT

An RF VCO (260A) forms, in the preferred embodiment, a part of a dual mode mobile station (100). Also disclosed is a method for operating the VCO. The VCO is operated in a first frequency band using a first inductance (300A) that forms part of a first resonant circuit (parallel resonance), and the VCO is switched for operation to a second frequency band by the closing a switch (M5) that causes a second resonant circuit (serial resonance) to be inductively coupled to the first resonant circuit. The second resonant circuit includes a second inductance (300B), and preferably includes at least one frequency tunable component, such as a varactor (VR3, VR4), for adjusting the resonant frequency of the second resonant circuit. The second inductance is center tapped, and the switch, such as a MOS transistor, is coupled in series between two ends of the center tapped inductance. The first frequency band may include 3.6 GHz (a double frequency GSM band) and the second frequency band may include 4.3 GHz (a double frequency WCDMA band). Additional operational bands can be also be used. In the preferred embodiment the first inductance forms part of a transformer primary fabricated in an integrated circuit, and the second inductance forms part of the transformer secondary that is fabricated in the integrated circuit so as to underlie the first inductance. A signal detector (D1, D2) may be provided that is responsive to a signal induced in the transformer secondary, and the signal detector has an output coupled to a closed loop control circuit (310) for controlling a magnitude of a signal output from the VCO. A further input to the closed loop control circuit may be a signal that is indicative of communication channel conditions, and the current consumption of the VCO circuit is maintained at a level that is adequate to ensure operation with the communication channel conditions. A passive buffering circuit (320) is provided for coupling an output of the VCO circuit to a further circuit, such as a mixer, thereby reducing the total VCO current considerably.

32 Claims, 6 Drawing Sheets

FIG.1A
VCO 260A

Primary CT
2B
Secondary out
Secondary CT
Passive buffering 320
Primary out
320

FIG. 2B

Insulator
Primary 300A
Metal5
Metal4
Metal3
Metal2
Secondary 300B
Tungsten vias to stack the different metals together

METHOD AND APPARATUS PROVIDING A DUAL MODE VCO FOR AN ADAPTIVE RECEIVER

TECHNICAL FIELD

These teachings relate generally to radio frequency (RF) receivers and, more specifically, relate to methods and apparatus for optimizing the performance of receivers such as those found in cellular telephones and other types of mobile communication devices and terminals.

BACKGROUND

The following abbreviations are herewith defined:

| | |
|---|---|
| ADC | analog-to-digital converter |
| BB | baseband |
| BiCMOS | bipolar and complementary metal oxide semiconductor |
| CDMA | code division multiple access |
| DAC | digital-to-analogue converter |
| IC | integrated circuit |
| LO | local oscillator |
| PN | phase noise |
| Q | quality factor |
| RF | radio frequency |
| RX | receiver |
| SW | software |
| UI | user interface |
| VCO | voltage controlled oscillator |
| VDD | power supply voltage |

The power consumption of the third generation (3G) and multi-mode mobile phones is expected to increase as compared to present mobile communication systems. This is due at least in part to an expected increase in the required operational and the stand-by times. A need thus exists to even further reduce the power consumption of modem mobile phones.

A significant consumer of power in the mobile phone receiver is the VCO. The VCO is an important component that is used when automatically tuning in a high speed manner between different frequency channels. In conventional practice multi-mode operation is normally accommodated by the use of separate VCOs, one for each frequency band of interest. However, this approach obviously increases the cost and, in some cases, the power consumption. Another technique employs switched capacitor tuning. However, this approach does not necessarily provide a sufficiently wide frequency tuning range when state of the art performance is required.

The use of a tuneable current and/or rectifier in a VCO to tune the VCO core gain to achieve a more optimized performance, or to insure oscillation, is known in the art, as evidenced by A. Zanchi, A. Bonfanti, S. Levantino, C. Samori, and A. L. Lacaita: "Automatic Amplitude Control Loop for A 2-V, 2.5-GHz LC-tank VCO" IEEE 2001.

However, further improvements and enhancements to dual mode VCOs are required in order to meet the stringent demands of modern mobile communications systems.

SUMMARY OF THE PREFERRED EMBODIMENTS

The foregoing and other problems are overcome, and other advantages are realized, in accordance with the presently preferred embodiments of these teachings.

In one aspect this invention provides for reducing the size and the current consumption of a dual frequency VCO circuit, where one core VCO is capable of operating in two different frequency bands with the aid of a transformer-connected serial resonance circuit. In a further aspect of this invention the VCO current is controlled by an amplitude/oscillation controlling circuit, where a rectifier/peak detector output signal may be used to determine whether the oscillator is operating or not. While the use of a VCO amplitude control loop may be generally known, the operation of an amplitude control loop when controlled by an algorithm of an adaptive receiver is not. If the requirement for the phase noise, defined by the received signal conditions, is less than a worst case value, the current consumption of the VCO can be reduced accordingly in an adaptive manner.

The VCO and its support circuits can be included on-chip along with other receiver components. The use of the on-chip design provides benefits in the form of accurate knowledge of loading and process variation effects. Because of this, an active buffer is replaced by passive buffering. The VCO buffer current consumption is typically 20%–30% of the VCO total power consumption. While the general idea of using a passive impedance transformation in order to isolate a VCO resonator from a load may be known, the use of passive impedance transformation in an on-chip implemented VCO is not. A benefit of this approach is a reduction in power consumption, as compared to an active buffer embodiment, such as one provided by a MOS source follower amplifier.

By the use of this invention the VCO current consumption can be reduced significantly. As was stated above, in conventional practice dual-mode operation is normally accommodated by the use of separate VCOs, one for each frequency band of interest. However, this approach obviously increases the cost and, in some cases, the power consumption. Another technique would employ switched capacitor tuning. However, approach does not provide a wide enough frequency tuning range when state of the art performance is required.

As was also stated above, it is known to use a tuneable current and/or rectifier in the VCO to tune the core gain. However, what is not known is a technique for adjusting the VCO to use it to reduce the current consumption, using information derived under different signal reception conditions.

A further benefit that is derived from the use of this invention is the realization of a sufficiently wide frequency separation between first and second operating bands (e.g., between WCDMA and GSM bands), while using only about one half of the chip area as compared to the use of two separate VCOs. In addition, a transformer impedance transformation reduces the effects of undesired components from the circuit that are added to the VCO to create the additional frequency band. It also provides a possibility to effectively detach these additional components while the VCO is operating an another frequency band. The use of the transformer thus reduces the effective loading of the resonator, and renders feasible a GSM/WCDMA on-chip VCO design. The transformer can also be used to connect other circuits to the VCO core without disturbing the operation of the VCO core significantly (i.e., a high degree of isolation is proved for the VCO core.)

While the Q of the transformer primary may be slightly less when the secondary is disposed beneath it in the chip layout, it is shown that by the use of a preferred layout, with careful design, the overall Q of the structure can be increased.

Disclosed herein is an RF VCO that forms, in the preferred embodiment, a part of a dual mode mobile station.

Also disclosed is a method for operating the VCO. The VCO is operated in a first frequency band using a first inductance that forms part of a first resonant circuit (parallel resonance), and the VCO is switched for operation to a second frequency band by the closing a switch that causes a second resonant circuit (serial resonance) to be inductively coupled to the first resonant circuit. The second resonant circuit includes a second inductance, and preferably includes at least one frequency tunable component, such as a varactor, for adjusting the resonant frequency of the second resonant circuit. In the preferred embodiment of this invention both inductances are differential, and the switch, such as a MOS transistor or a MEMS component, is coupled in series between two ends of the center tapped secondary inductance.

As non-limiting examples, the first frequency band includes 3.6 GHz (a double frequency GSM band) and the second frequency band includes 4.3 GHz (a double frequency WCDMA band).

In the preferred embodiment the first inductance forms part of a transformer primary fabricated in an integrated circuit, and the second inductance forms part of the transformer secondary that is fabricated in the integrated circuit so as to underlie the first inductance.

Further in accordance with an aspect of this invention a signal detector is responsive to a signal induced in the transformer secondary, where the signal detector has an output coupled to a closed loop control circuit for controlling a magnitude of a signal output from the VCO. A further input to the closed loop control circuit may be a signal that is indicative of communication channel conditions, and the current consumption of the VCO circuit is maintained at a level that is adequate to ensure operation with the communication channel conditions.

An example of a system that can be used with this type of adaptive and dual band VCO is disclosed in commonly assigned U.S. Provisional Patent Application No.: 60/344,699, filed Dec. 28, 2001, entitled "Method and Apparatus for Scaling the Dynamic Range of a Receiver for Continuously Optimizing Performance versus Power Consumption", by Aarno Pärssinen, Paul Seppinen, Jussi Vepsäläinen, Mikael Gustafsson and Miika Hämäläinen, the disclosure of which is incorporated by reference herein in its entirety.

Further in accordance with an aspect of this invention a passive buffering circuit is provided for coupling an output of the VCO circuit to a further circuit, such as a mixer or, as a further example, a divider.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIGS. 1A–1F, which may be collectively referred to as FIG. 1, are useful in understanding the presently preferred embodiments of this invention, where

DETAILED DESCRIPTION OF THE PREFERRED EMBODIMENTS

Figure 7:
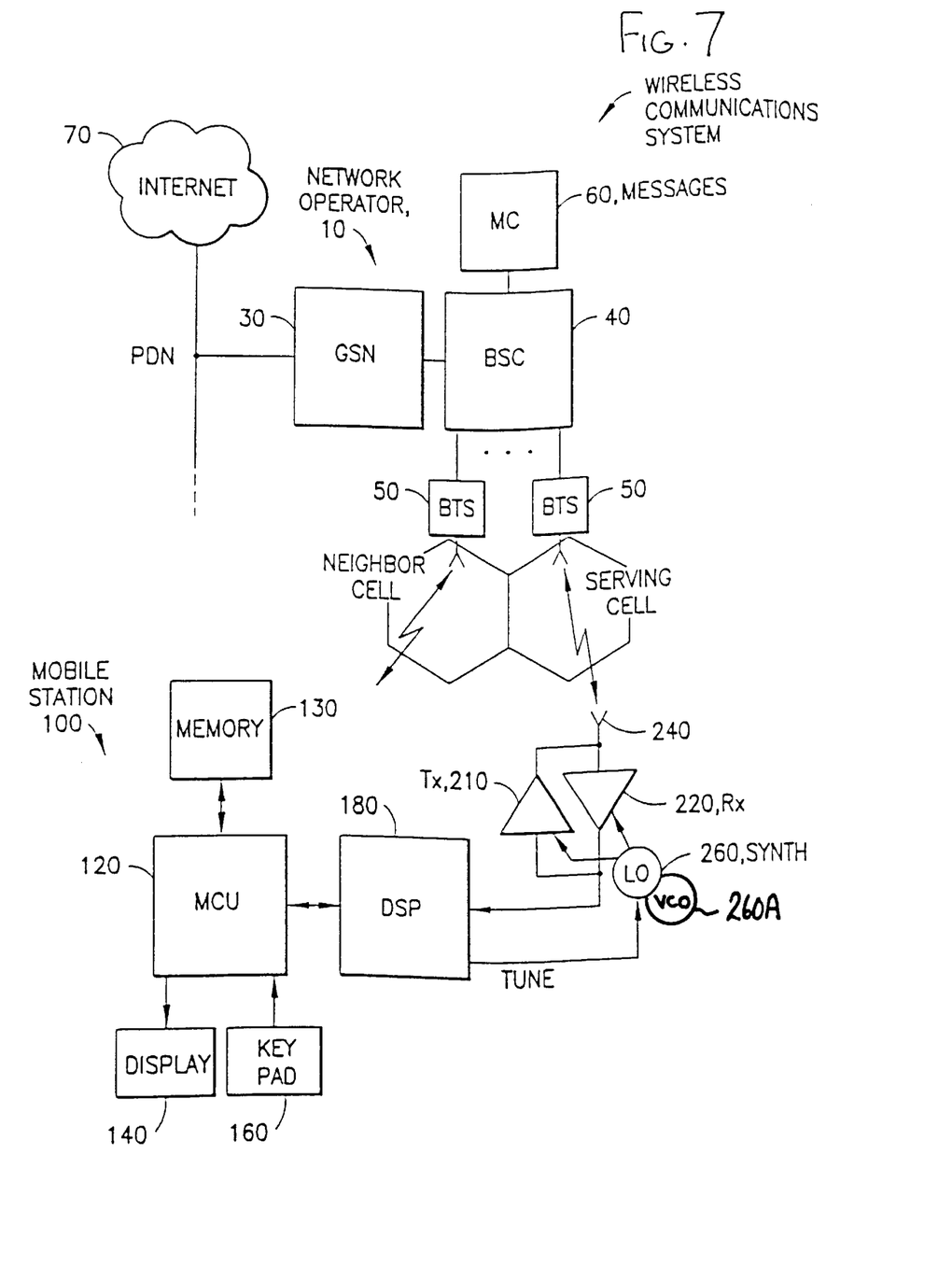
FIG. 7 is a block diagram of a wireless communications system that includes a mobile station having a VCO that is constructed and operated in accordance with this invention.

In order to place this invention into a suitable technological context, reference is first made to FIG. 7 where there is illustrated a simplified block diagram of an embodiment of a wireless communications system that includes at least one mobile station (MS) 100 that is suitable for practicing this invention. FIG. 8 also shows an exemplary network operator having, for example, a GPRS Support Node (GSN) 30 for connecting to a telecommunications network, such as a Public Packet Data Network or PDN, at least one base station controller (BSC) 40, and a plurality of base transceiver stations (BTS) 50 that transmit in a forward or downlink direction both physical and logical channels to the mobile station 100 in accordance with a predetermined air interface standard. Each BTS 50 is assumed to support a cell. A reverse or uplink communication path also exists from the mobile station 100 to the network operator, which conveys mobile originated access requests and traffic.

The air interface standard can conform to any suitable standard or protocol, and may enable both voice and data traffic, such as data traffic enabling Internet 70 access and web page downloads. One suitable type of air interface is based on TDMA and may support a GSM or an advanced GSM protocol, although these teachings are not intended to be limited to TDMA or to GSM or GSM-related wireless systems. In fact, another wireless system and air interface, such as a WCDMA system, may serve at least a part of the geographical area served by the wireless communication system shown in FIG. 7, and the MS 100 is then in a preferred embodiment a multi-band terminal that is capable of operating with either the GSM or the WCDMA network. Alternatively, it may a single-band terminal that operates only with the WCDMA system.

The network operator may also include a suitable type of Message Center (MC) 60 that receives and forwards messages for the mobile stations 100. Other types of messaging service may include Supplementary Data Services and one under currently development and known as Multimedia Messaging Service (MMS), wherein image messages, video messages, audio messages, text messages, executables and the like, and combinations thereof, can be transferred between the network and the mobile station 100.

The mobile station 100 typically includes a microcontrol unit (MCU) 120 having an output coupled to an input of a display 140 and an input coupled to an output of a keyboard or keypad 160. The mobile station 100 may be a handheld radiotelephone, such as a cellular telephone or a personal communicator. The mobile station 100 could also be contained within a card or module that is connected during use to another device. For example, the mobile station 10 could be contained within a PCMCIA or similar type of card or module that is installed during use within a portable data processor, such as a laptop or notebook computer, or even a computer that is wearable by the user.

The MCU 120 is assumed to include or be coupled to some type of a memory 130, including a read-only memory (ROM) for storing an operating program, as well as a random access memory (RAM) for temporarily storing required data, scratchpad memory, received packet data, packet data to be transmitted, and the like. A separate, removable SIM (not shown) can be provided as well, the SIM storing, for example, a preferred Public Land Mobile Network (PLMN) list and other subscriber-related information. The ROM is assumed, for the purposes of this invention, to store a program enabling the MCU 120 to execute the software routines, layers and protocols required to operate in the wireless communications system, as well as to provide a suitable user interface (UI), via display 140 and keypad 160, with a user. The stored program also is operable for executing the methods and algorithms in accordance with these teachings, such as and including the methods illustrated in FIGS. 7 and 10. Although not shown, a microphone and speaker are typically provided for enabling the user to conduct voice calls in a conventional manner.

The mobile station 100 also contains a wireless section that includes a digital signal processor (DSP) 180, or equivalent high speed processor or logic or control unit, as well as a wireless transceiver that includes a transmitter (Tx) 200 and a receiver (Rx) 220, both of which are coupled to an antenna 240 for communication with the network operator via the BTS 50. At least one local oscillator (LO) 260, such as a frequency synthesizer, is provided for tuning the transceiver, and the LO 260 is assumed to include a VCO 260A in accordance with the teachings of this invention. Data, such as digitized voice and packet data, is transmitted and received through the antenna 240.

Note is first made of the fact that this invention includes a number of aspects that may be used separately or combined to reduce the cost and the power consumption of the VCO 260A. While described herein primarily in the context of operation in the WCDMA and 900/1800 MHz GSM bands, the teachings of this invention are not restricted for use in any particular frequency band or bands. These teachings are also not restricted to use in any specific type of wireless architecture, and could be used in, for example, architectures that feature direct conversion receivers as well as superheterodyne receivers.

Figure 1A:
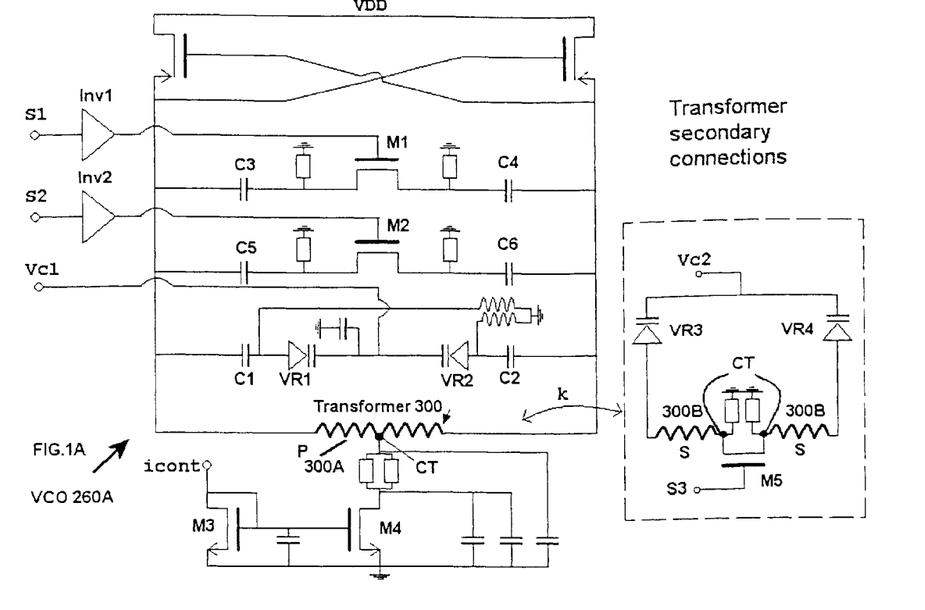
FIG. 1A is a schematic diagram of a dual mode VCO.
Figure 1B:
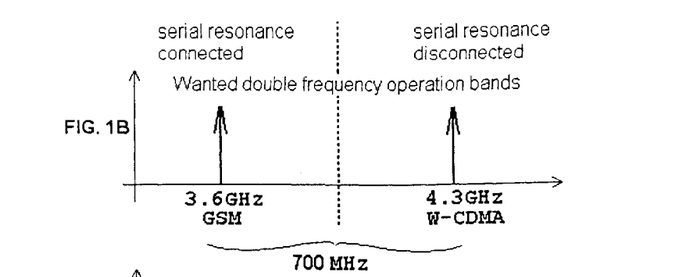
FIGS. 1B–1E are graphs depicting the operational principle of the transformer connected serial resonance circuit at the frequency plane.
Figure 1C:
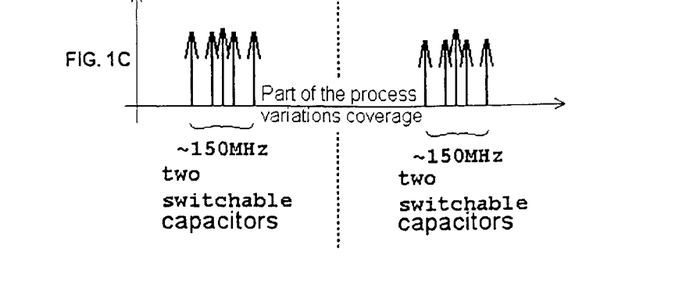

Referring to FIG. 1A the VCO 260A includes a transformer 300 where the primary (p) coil is an inductive load to the active negative resistance. This means that when the serial portion in transformer secondary (s) coil is damped totally with a large serial switch off-resistance, the VCO 260A operates in one frequency band without the effect of the components coupled through the secondary. Referring also to FIGS. 1B and 1C, assume that the two bands of interest are the 3.6 GHz GSM band and the 4.3 GHz WCDMA band (i.e., two bands separated by 700 MHz). The use of switched capacitor tuning may not provide a sufficiently large tuning range to cover both operational bands, especially when the effects of circuit process variations are considered.

A basic operational principle of the VCO 260A is the negative resistance that is used to cancel the losses in the resonant circuit tank, as the VCO 260A in FIG. 1 would appear without the transformer 300 secondary connection (i.e., if the primary functioned simply as a tank circuit inductance). The oscillation frequency is determined by the resonant frequency formed by the primary coil 300A, varactors VR1 and VR2 (and serial DC coupling capacitors C1, C2) as tuned by Vc1, and switched capacitors C3, C4, C5 and C6 and associated switches M1 and M2 that are used to cancel at least some component process variations, and the parasitic capacitances at the oscillation node.

Without the transformer secondary this type of circuit can be used to cover some hundreds of MHz of frequency band and at the same time meet the GSM phase noise specification. In the prior art multi-mode operation may be provided with two (or more) of these types of oscillators, one for each band.

In accordance with this invention by the use of the serial resonance connection (the transformer secondary 300B) the overall inductive impedance seen at the primary 300A is larger than the impedance without the serial connection. This (coarse) change in the inductive impedance is realized by turning on and off the MOS switch M5 in the secondary 300B (turning off M5 effectively opens the current path of the secondary coil.) Fine-tuning of the resonance frequency is preferably achieved with control voltage Vc2 and Vc1, in conjunction with secondary varactors VR3 and VR4 and also primary varactors VR1 and VR2, to achieve the best possible performance.

It should be noted that in this (non-limiting) embodiment the serial resonance is used to reduce the oscillation frequency. However, in other embodiments the serial resonance can be used instead to increase the oscillation frequency, simply by changing the component values in the core VCO.

Figure 1D:
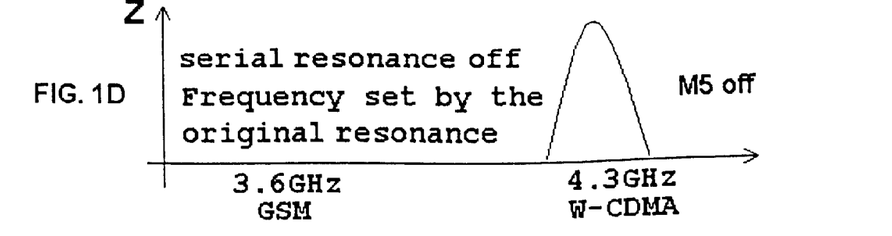
Figure 1E:
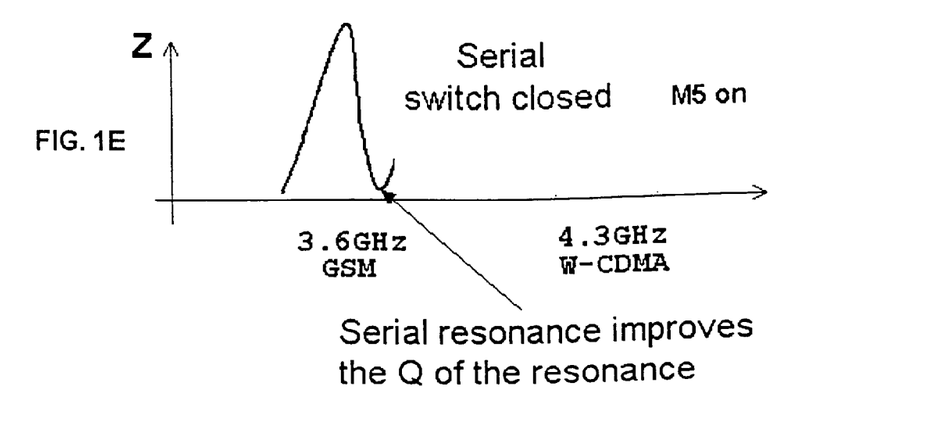
Figure 1F:
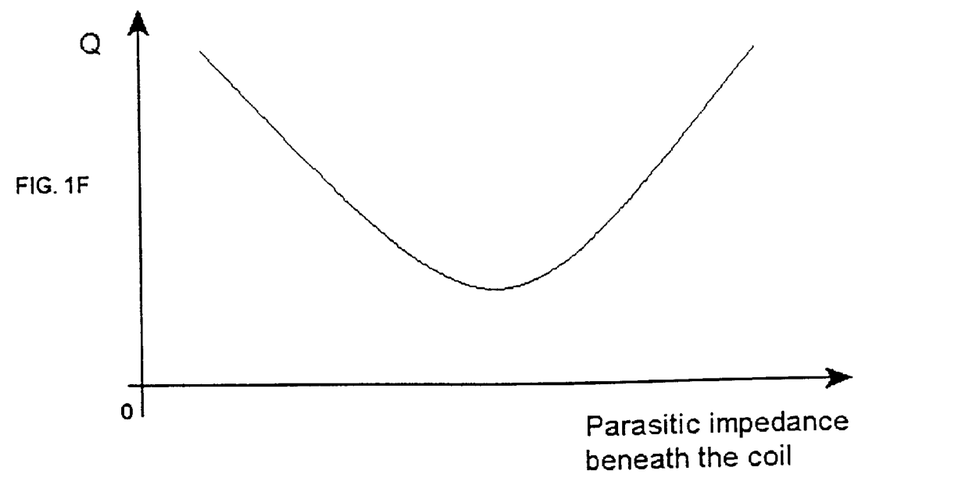
FIG. 1F is a graph of the coil Q versus substrate impedance curve.

The frequency plane representation in FIG. 1A indicates that a 700 MHz separation between the double frequency GSM and WCDMA bands can be realized by the use of the transformer connected serial resonance. The impedance Z shown in FIGS. 1D and 1E illustrates the change that occurs when the MOS switch M5 in the secondary 300B is off and on, respectively, in this embodiment. FIG. 1F shows the change in Q due to the parasitic impedance beneath the transformer primary 300A coil in the integrated circuit layout.

The diagrams and graphs of FIG. 1 illustrate the use of the transformer connected serial resonance to create two (or more) separate operational frequency bands.

In FIG. 1A the inputs: S1,S2 are for controlling the switched capacitance connections, via inverters inv1 and inv2, respectively; Vc1 is the primary varactor (VR1,VR2) voltage tuning signal; Vc2 is the secondary varactor (VR3, VR4) voltage tuning signal, Icont is a reference current for a current mirror formed by M3, M4 for the VCO 260A, and k indicates the coupling coefficient between the primary 300A and the secondary 300B.

When the resonance of the transformer coupled secondary circuit is moved closer to the primary circuit resonance it begins to push the primary resonance. In the preferred but non-limiting embodiment the serial resonance frequency is about two times the parallel resonance frequency. This effect is at its maximum when the switch (M5) on-resistance is at a minimum. The result is that the transformer coupled secondary circuit can shift the operational frequency of the primary circuit by at least 1 GHz, if a sufficiently high Q in the serial circuit is used, and is clearly adequate to cover the case of the exemplary GSM and WCDMA VCO operational bands.

Since the frequency-tuning range in the GSM band is larger than the required range of the WCDMA band, and to obtain optimum phase noise results, both varactors VR1 and VR2 are in use. In contrast, as the WCDMA frequency range is smaller then only one varactor VR1 is in use. In this case the secondary varactors are detached by switch M5. Also, this type of coupling improves the phase noise performance at lower frequencies. This is true because the Q of the resonant circuit is improved by the parallel resonance.

The WCDMA VCO operates with very low currents, because of the large primary coil and thus the high negative resistance. The use of the large primary coil 300A is preferably designed for impedance transformation purposes.

Figure 2A:
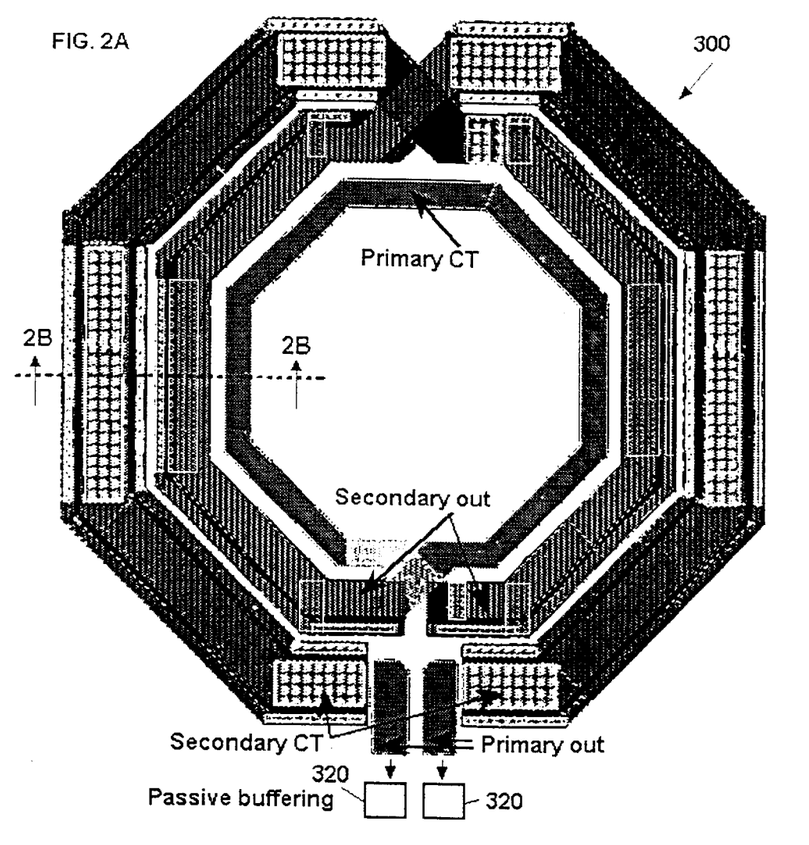
FIG. 2A is a top view illustrating a differential transformer structure constructed on a silicon wafer.
Figure 2B:
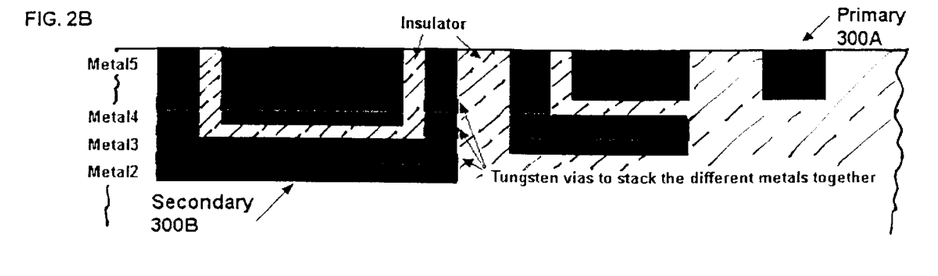
FIG. 2B is a cross-sectional view (not to scale) taken along the section line 2B–2B in FIG. 2A.

FIG. 2A is a top view of an exemplary transformer 300 layout, and shows the overall configuration of the primary 300A outputs and centertap (CT), as well as the secondary outputs and centertap. FIG. 2B is a cross-sectional view (not to scale) taken along the section line 2B—2B in FIG. 2A. In this case vias (e.g., tungsten vias) are used to stack the various metal layers. This is advantageous as it reduces the serial resistance in the coil. While the size of the transformer 300 can vary, in general the transformer embodiment that is illustrated is about 20 microns larger than would be a simple conventional inductor-only embodiment with the same inductance value as the coil of the transformer primary 300A. At least four metal levels are preferred for constructing the transformer 300, and the secondary 300B underlies the primary 300A, as was mentioned above. However, the transformer 300 could be constructed by any desired technique, such as by the use of one metal layer.

More specifically, it can be shown that it is beneficial to have a large impedance ratio and high coupling between the primary winding 300A and the secondary winding 300B. The coupling requirement automatically implies that the secondary 300B should be located beneath the primary 300A. This is because the distance between the metal layers is very small as compared to the precision of the lateral accuracy. The preferred, but not limiting, process includes the use of a thick metal layer. Due to the relatively thick top metal layer the secondary 300B is found partly also at the top layer to reduce the secondary coil serial resistance and to further increase the coupling.

While the Q of the transformer primary coil 300A may be slightly less when the secondary coil 300B is disposed beneath it, in the preferred layout with careful design the overall Q of the structure can be increased. How this is possible can be seen from the Q versus substrate resistance curve in FIG. 1F. This graph indicates that the Q is higher when the secondary circuit is at resonance, thereby partly shorting the effects of the IC substrate. Conventional ground shielding and patterning can be used to provide a similar effect.

Figure 3A:
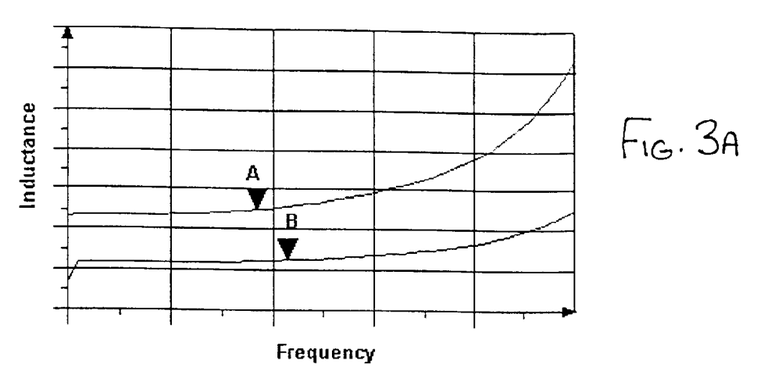
FIGS. 3A and 3B plot transformer inductance and inductor Q versus frequency.
Figure 3B:
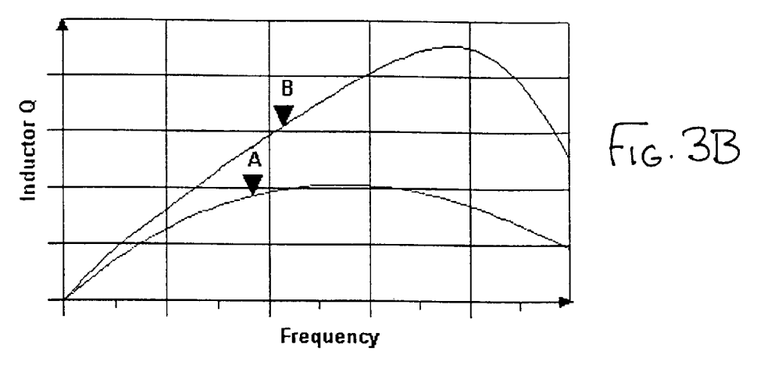

FIGS. 3A and 3B plot transformer inductance and inductor Q versus frequency.

The use of this type of transformer 300 in the VCO 260A is multi-functional in terms of connecting other components or additional circuits to the core of the VCO 260A, without inducing major disturbances to the operation of the VCO 260A. One possible connection may be made with a passive double-balanced diode mixer, while another may be made to a frequency divider.

The advantages that are realized by the use of this invention are several. The serial resonance connection changes the operational frequency and at least the phase noise (at small offsets) is improved. The phase noise with larger offsets is also improved when the serial resonance has an improved Q.

Figure 4:
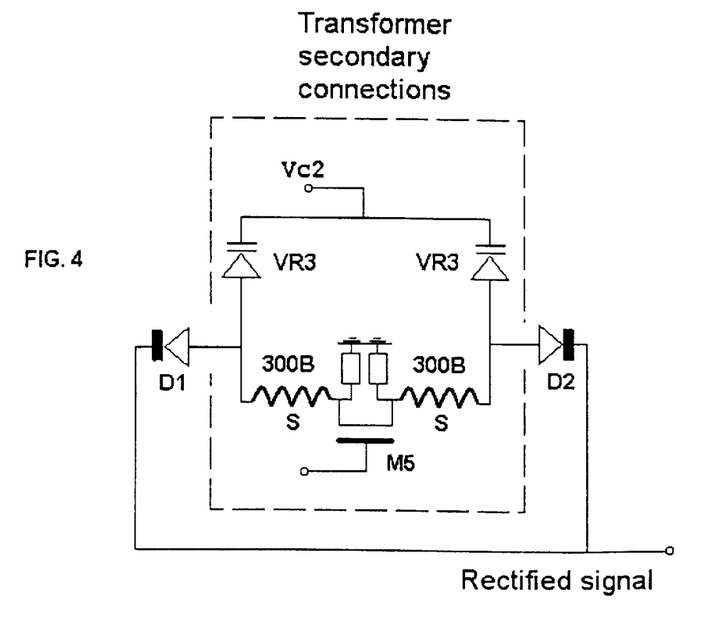
FIG. 4 is a schematic diagram showing a technique to loosely couple different components to the oscillator core, and is one embodiment of the transformer in the VCO.
Figure 5:
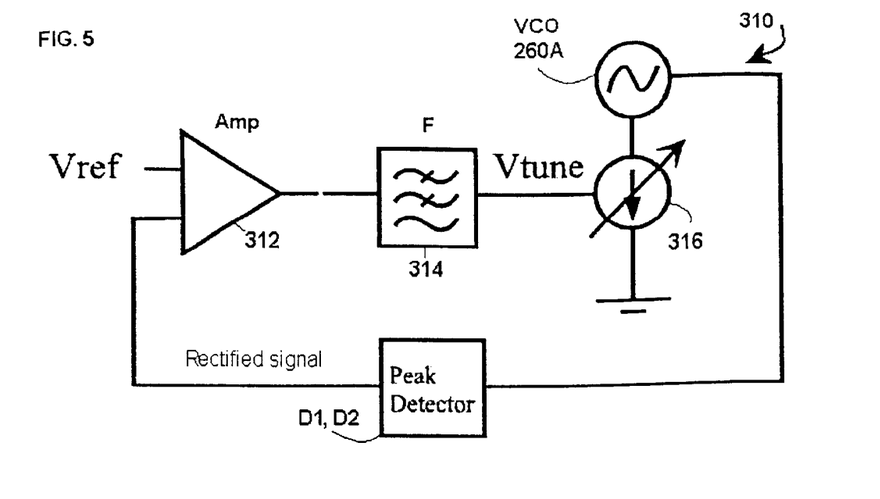
FIG. 5 is block diagram for an amplitude control circuit used for power consumption control, where peak detector diodes may be connected to the transformer secondary and in parallel with the varactor, as shown in FIG. 4.

Note that other secondary circuit configurations are possible. For example, FIG. 4 shows a secondary 300B circuit that adds rectifier diodes D1 and D2 in parallel with the varactor diodes VR3 and VR4. The rectifier diodes D1 and D2 function as peak detector diodes. That is, and referring also to FIG. 5, an amplitude control circuit 310 can be used for power consumption control, where the peak detector diodes D1 and D2 can be connected to the transformer secondary 300B, in parallel with the varactor diodes VR3, VR4, as shown in FIG. 4. The added functionality of power consumption reduction makes the use of the amplitude control circuit 310 desirable, whereas if used only for providing oscillation security or a phase noise improvement the advantages may not always outweigh the increased layout size. In FIG. 5 the amplitude control circuit 310 includes an amplifier 312 that has one input coupled to a voltage reference signal (Vref) and an output coupled to the current mirror 316, formed by M3, M4, of the VCO 260A through low pass filter (F) 314. This signal is referred to as Vtune, and from it is derived the icont signal shown in FIG. 1A. A second input of the amplifier 312 is the received signal output by D1 and D2, as shown in FIG. 4, and a closed loop control system is thus formed.

When information that indicates a received signal condition (e.g., BER, a value of AGC, etc.) is used to tune the amplitude control circuit 310 (via the value of Vref), operation with a minimum electrical current for the current channel conditions is made possible. The channel sensing circuit preferably maintains the VCO 260A running with a minimum preset amplitude level, below which the system is not permitted to reduce the operational current.

A further aspect of these teachings pertains to the use of passive buffering to even further reduce the VCO current. The passive buffering circuit 320 (see FIGS. 6A and 6B) is selected according to its effects on the phase noise of the VCO 260A, and therefore a simple physical resistance is not a viable circuit solution. It is preferred instead that the optimum serial impedance is divided into two parts to obtain the required impedance transformation. The components can be considered as resistors at the desired frequency. The capacitance and diode values and sizes are tuned in accordance with worst-case simulations. This structure can also be used to reduce the loading and the off-mode current, in an embodiment where two separate VCOs are connected to the same frequency divider, without reducing the performance when the diode (M10) is not conducting (notice the use of the inverter). The use of switches or other large active components in series with the oscillator signal path is not preferred at the relatively high frequencies that are employed. Because the diode (M10) is forward biased there is some very small amount of current flowing through it.

Considering now the passive buffering in further detail, the output for the negative resistance oscillator is over the coil (primary 300A), meaning that two passive buffering circuits 320 are used, one for each side of the primary coil output. The buffer 320 is considered to be passive since the current consumption is only a few micro-amperes and there is no amplifying gain stage. The npn transistor M10 functions as a forward biased diode. The diode and the capacitor Cin operate as a serial impedance for the output signal. The MOS switches/resistors M11, M12 and M13 operate in parallel to the signal. The MOS switches are marked as being "open" in FIG. 6B, where the value of the total resistance seen by the signal is about 500 ohms (it is not purely resistive). Note that the use of a physical serial resistance, as opposed to the embodiment disclosed in FIG. 6A, would significantly increase the noise. It is important that the signal at the output of the passive buffering 320 be sufficiently large, while the capacitive loading be as small as possible. The disclosed structure also allows the diode (M10) to be closed. The inverter M13 controlled by the on/off node is used to reverse bias the diode (M10).

Figure 6A:
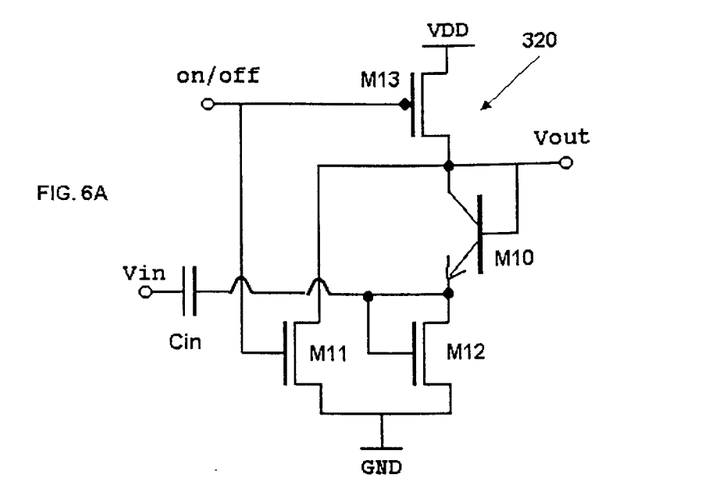
FIG. 6A is a schematic diagram of a passive buffering circuit.
Figure 6B:
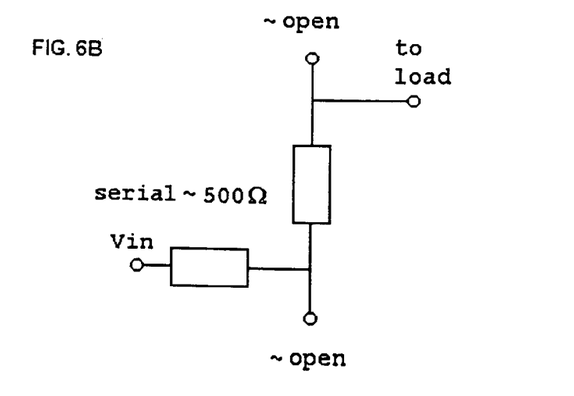
FIG. 6B shows a corresponding equivalent circuit.

A significant improvement that is achieved through the use of the passive buffering circuit 320 is the reduction in the noise floor and the total VCO current.

While described in the context of presently preferred embodiments of this invention, those having skill in the art should appreciate that variations in form and detail may be made, and that all such changes will still fall within the scope of the teachings of this invention. For example, this invention should not be viewed as being limited to the specific VCO secondary circuit embodiments shown in the Figures and described above, nor for use with only specific frequencies, ranges of frequencies, values of inductance, types of receivers, or with only certain wireless communications standards and protocols, such as only with GSM or WCDMA systems.

Furthermore, while the serial resonance has been described as being coupled to the parallel resonance using the transformer 300, in other embodiments it can be coupled directly (as opposed to being coupled magnetically) to the main coil, without using the transformer.

Also, the serial resonance has been described as being decoupled by moving the resonance frequency so far from the parallel resonance that its effect is reduced so as to be essentially insignificant. In the illustrated embodiments this is performed using the MOS switch (M5). However, other suitable methods can be used to tune the serial resonance frequency, such as, but not necessarily limited to, switchable capacitors or an active inductor.

What is claimed is:

1. A method for operating a radio frequency RF voltage controlled oscillator VCO of a communications equipment, comprising:
   operating the VCO in a first frequency band, the VCO comprising a first inductance forming part of a parallel, first resonant circuit; and
   switching the VCO to a second frequency band by closing a switch to inductively couple a serial, second resonant circuit, comprising a second inductance, to the first resonant circuit.

2. A method as in claim 1, where the first frequency band includes 3.6 GHz, and where the second frequency band includes 4.3 GHz.

3. A method as in claim 1, where the first frequency band is a double frequency GSM frequency band, and where the second frequency band is a double frequency WCDMA frequency band.

4. A method as in claim 1, where the first inductance comprises a transformer primary fabricated in an integrated circuit, and where the second inductance comprises a transformer secondary fabricated in said integrated circuit such that both inductances are magnetically coupled one to the other.

5. A method as in claim 1, where the step of switching includes a step of adjusting the frequency by a step of tuning the resonant frequency of the second resonant circuit.

6. A method as in claim 5, where the step of tuning comprises applying a voltage to at least one varactor.

7. A method as in claim 4, and further comprising detecting a signal induced in the transformer secondary, and feeding said detected signal into a closed loop control circuit to control a magnitude of a signal output from said VCO.

8. A method as in claim 7, where a further input to said closed loop control circuit comprises a signal that is indicative of communication channel conditions, and where the current consumption of the VCO circuit is maintained at a level that is adequate to ensure operation with the communication channel conditions.

9. A method as in claim 4, and further comprising coupling an output of said VCO circuit to a further circuit through a passive buffering circuit.

10. A method as in claim 1, where said second inductance is center tapped, and where said switch is coupled in series between two ends of said center tapped inductance.

11. A radio frequency RF voltage controlled oscillator VCO forming a part of a mobile station, said VCO being operated in a first frequency band using a first inductance that forms part of a first resonant circuit, said VCO being switched for operation to a second frequency band by the closing a switch that causes a second resonant circuit to be inductively coupled to said first resonant circuit, said second resonant circuit comprising a second inductance.

12. A VCO as in claim 11, where the first frequency band includes 3.6 GHz, and where the second frequency band includes 4.3 GHz.

13. A VCO as in claim 11, where the first frequency band enables GSM operation, and where the second frequency band enables WCDMA operation.

14. A VCO as in claim 11, where the first inductance comprises a transformer primary fabricated in an integrated circuit, and where the second inductance comprises a transformer secondary fabricated in said integrated circuit such that both inductances are magnetically coupled one to the other.

15. A VCO as in claim 11, where said second resonant circuit comprises a frequency tunable component for adjusting the resonant frequency of the second resonant circuit.

16. A VCO as in claim 15, where said frequency tunable component comprises at least one varactor.

17. A VCO as in claim 14, and further comprising a signal detector responsive to a signal induced in said transformer secondary, said signal detector having an output coupled to a closed loop control circuit for controlling a magnitude of a signal output from said VCO.

18. A VCO as in claim 17, where a further input to said closed loop control circuit comprises a signal that is indicative of communication channel conditions, and where the current consumption of the VCO circuit is maintained at a level that is adequate to ensure operation with the communication channel conditions.

19. A VCO as in claim 14, and further comprising a passive buffering circuit for coupling an output of said VCO circuit to a further circuit utilizing diodes as coupling components.

20. A VCO as in claim 11, where said second inductance is center tapped, and where said switch is coupled in series between two ends of said center tapped inductance.

21. A VCO as in claim 11, where said first resonance circuit forms a parallel resonance circuit, and where operation in at least said second frequency band is achieved by introducing said second resonance circuit that forms a serial resonance circuit sufficiently close to said first resonance circuit.

22. A radio frequency RF voltage controlled oscillator VCO forming a part of a multi-mode mobile station, said VCO being operated in a first frequency band using a first inductance that forms part of a parallel resonant circuit, said VCO being switched for operation to a second frequency band by coupling said parallel resonant circuit to a serial resonant circuit that comprises a second inductance, said serial resonant circuit having a resonance frequency that is close to a resonance frequency of said parallel resonant circuit.

23. A VCO as in claim 22, where said parallel resonant circuit is magnetically coupled to said serial resonant circuit.

24. A VCO as in claim 22, where said parallel resonant circuit is non-magnetically coupled to said serial resonant circuit.

25. A VCO as in claim 22, where said parallel resonant circuit is coupled to said serial resonant circuit by closing a switch enabling current to flow through said serial resonant circuit.

26. A VCO as in claim 22, where said parallel resonant circuit is decoupled from said serial resonant circuit by shifting the resonance frequency of said serial resonant circuit away from the resonance frequency of said parallel resonant circuit such that it has only a small effect on the resonance frequency of said parallel resonant circuit.

27. A VCO as in claim 26, where said parallel resonant circuit is decoupled from said serial resonant circuit by opening a switch in a current flow path of said serial resonant circuit.

28. A VCO as in claim 26, where said parallel resonant circuit is decoupled from said serial resonant circuit by operating one of at least one switchable capacitor or active inductor.

29. A VCO as in claim 22, where a current consumption of said VCO is controlled by said mobile station as a function of RF channel conditions.

30. A VCO as in claim 22, where said parallel resonant circuit comprises a transformer primary that is magnetically coupled to and decoupled from said serial resonant circuit that comprises the transformer secondary.

31. A VCO as in claim 30, where said transformer primary and said transformer secondary are fabricated in an integrated circuit.

32. A VCO as in claim 22, and further comprising a passive buffering circuit for coupling an output of said VCO to another circuit.

* * * * *